(12) United States Patent
Norman

(10) Patent No.: US 8,456,880 B2
(45) Date of Patent: Jun. 4, 2013

(54) MULTIPLE LAYERS OF MEMORY IMPLEMENTED AS DIFFERENT MEMORY TECHNOLOGY

(75) Inventor: Robert Norman, Pendleton, OR (US)

(73) Assignee: Unity Semiconductor Corporation, Sunnyvale, CA (US)

( * ) Notice: Subject to any disclaimer, the term of this patent is extended or adjusted under 35 U.S.C. 154(b) by 612 days.

(21) Appl. No.: 12/653,853

(22) Filed: Dec. 18, 2009

(65) Prior Publication Data

US 2010/0195363 A1  Aug. 5, 2010

Related U.S. Application Data

(60) Provisional application No. 61/206,395, filed on Jan. 30, 2009.

(51) Int. Cl.
*G11C 5/02* (2006.01)

(52) U.S. Cl.
USPC .................... 365/51; 365/63; 365/148

(58) Field of Classification Search
USPC ............... 365/148, 158, 163, 171, 173, 51, 365/63
See application file for complete search history.

(56) References Cited

U.S. PATENT DOCUMENTS

| | | | | |
|---|---|---|---|---|
| 5,768,563 A * | 6/1998 | Porter et al. | ...................... | 703/27 |
| 5,915,167 A * | 6/1999 | Leedy | ............................ | 438/108 |
| 6,704,230 B1 * | 3/2004 | DeBrosse et al. | ............. | 365/201 |
| 6,754,124 B2 * | 6/2004 | Seyyedi et al. | ................ | 365/214 |
| 6,967,865 B2 * | 11/2005 | Lee | ............................... | 365/163 |
| 7,093,099 B2 * | 8/2006 | Bodas et al. | ................... | 711/206 |
| 7,394,680 B2 * | 7/2008 | Toda et al. | ..................... | 365/148 |
| 7,402,897 B2 * | 7/2008 | Leedy | ............................ | 257/678 |
| 7,406,572 B1 * | 7/2008 | Nguyen | ......................... | 711/154 |
| 7,747,817 B2 * | 6/2010 | Norman | ......................... | 711/112 |
| 7,808,807 B2 * | 10/2010 | Parkinson et al. | ............... | 365/63 |
| 8,059,443 B2 * | 11/2011 | McLaren et al. | ................. | 365/64 |
| 8,064,739 B2 * | 11/2011 | Binkert et al. | ................... | 385/14 |
| 2002/0095280 A1 * | 7/2002 | Tung et al. | ..................... | 703/24 |
| 2006/0171200 A1 * | 8/2006 | Rinerson et al. | ............ | 365/185.1 |
| 2007/0285966 A1 * | 12/2007 | Toda et al. | ..................... | 365/148 |
| 2008/0005459 A1 * | 1/2008 | Norman | ......................... | 711/112 |
| 2008/0005591 A1 * | 1/2008 | Trautman et al. | .............. | 713/300 |
| 2008/0306723 A1 * | 12/2008 | De Ambroggi et al. | ......... | 703/21 |

* cited by examiner

*Primary Examiner* — Alexander Sofocleous
*Assistant Examiner* — Lance Reidlinger
(74) *Attorney, Agent, or Firm* — Stolowitz Ford Cowger LLP

(57) ABSTRACT

Circuits and methods that use third dimension memory as a different memory technology are described. The third dimension memory can be used for application specific data storage and/or to emulate conventional memory types such as DRAM, FLASH, SRAM, and ROM or new memory types as they become available. A processor-memory system implements a memory operable as different memory technologies. The processor-memory system includes a logic subsystem and a memory subsystem, which includes third dimension memory cells. The logic subsystem implements memory technology-specific signals to interact with the third dimension memory cells as memory cells of a different memory technology. As such, the memory subsystem can emulate different memory technologies. The logic subsystem can be fabricated FEOL on a substrate and the memory subsystem can be fabricated BEOL directly on top of the substrate. An interlayer interconnect structure can electrically couple the logic subsystem with the memory subsystem.

13 Claims, 7 Drawing Sheets

Background

"MULTIPLE LAYERS OF MEMORY IMPLEMENTED AS DIFFERENT MEMORY TECHNOLOGY"

FIELD OF THE INVENTION

Embodiments of the invention relate generally to data storage and computer memory, and more particularly, to systems, devices, and methods using multiple layers of memory as a different memory technology.

BACKGROUND OF THE INVENTION

Conventional semiconductor fabrication processes have reduced device geometries in the x, y and z dimensions so as to facilitate the fabrication of relatively dense, complex circuits as a "system on a chip," or SoC. An example of a SoC is the "multiprocessor" chip, which is composed of multiple processors, various memory technologies for satisfying different data storage requirements, and specialized circuits, all of which are fabricated as an integrated circuit. One type of specialized circuit is a communications port circuit, such as a conventional universal serial bus ("USB") port circuit. FIG. 1 depicts a functional diagram of a conventional processor-memory system 100 based on a multiprocessor 120 and various memory technologies. Specifically, multiprocessor 120 implements SRAM 101 as internal memory, and dynamic RAM ("DRAM") 102 and FLASH memory ("FLASH") 104 as external memories. Typically, DRAM 102 and FLASH 104 are conventional integrated circuit chips (e.g., in separate IC packages) that are soldered or otherwise electrically connected with a circuit board or substrate upon which multiprocessor 120 is mounted and are electrically connected with multiprocessor 120 using electrically conductive traces or the like. Multiprocessor 120 also contains specialized circuits, such as a universal serial bus circuit ("USB circ") 110 and a gigabit Ethernet circuit ("GEthernet circ") 112 to establish high-speed communications ports. Typically, each processor (not shown) in multiprocessor 120 corresponds with a dedicated static random access memory ("SRAM") block in the blocks of SRAM 101, which can operate as quickly as the processor. The SRAM memory blocks are usually designed for a "specific use," such as storing instructions for execution by a specific processor. A drawback to implementing SRAM 101 in multiprocessor 120 is that conventional SRAM cells are relatively large (e.g., compared to DRAM cells), and, thus, consume relatively large amounts of surface area (e.g., silicon die area).

A common approach to increase memory for multiprocessor 120 adds external DRAM and FLASH memories. DRAM provides relatively high-density RAM memory having a relatively large storage capacity for accommodating applications requiring large amounts of memory. FLASH memory provides long-term (i.e., non-volatile) memory, which neither SRAM 101 nor DRAM memories provide. Typically, DRAM and FLASH memories are used to store data for "general use" by multiple processors. A usual drawback to embedding DRAM and FLASH memory technologies in the same substrate that contains the multiple processors is that they increase the die size, which, in turn, leads to higher product costs. Further, embedding both FLASH and DRAM memory technologies within a single SoC usually requires different fabrication processes, which complicates the manufacturing of multiprocessor 120. To avoid the issues with embedding the various conventional memory technologies with the multiple processors, the DRAM and FLASH memories are implemented respectively as external dynamic RAM (DRAM) 102 and FLASH memory (FLASH) 104. However, at least one drawback of using external DRAM 102 and FLASH 104 is that, when combined with multiprocessor 120, more area is consumed on a printed circuit board, for example, than multiprocessor 120 alone.

There are continuing efforts to improve techniques, systems and devices for implementing memory with multiple processors.

BRIEF DESCRIPTION OF THE DRAWINGS

The invention and its various embodiments are more fully appreciated in connection with the following detailed description taken in conjunction with the accompanying drawings, in which.

Figure 1:
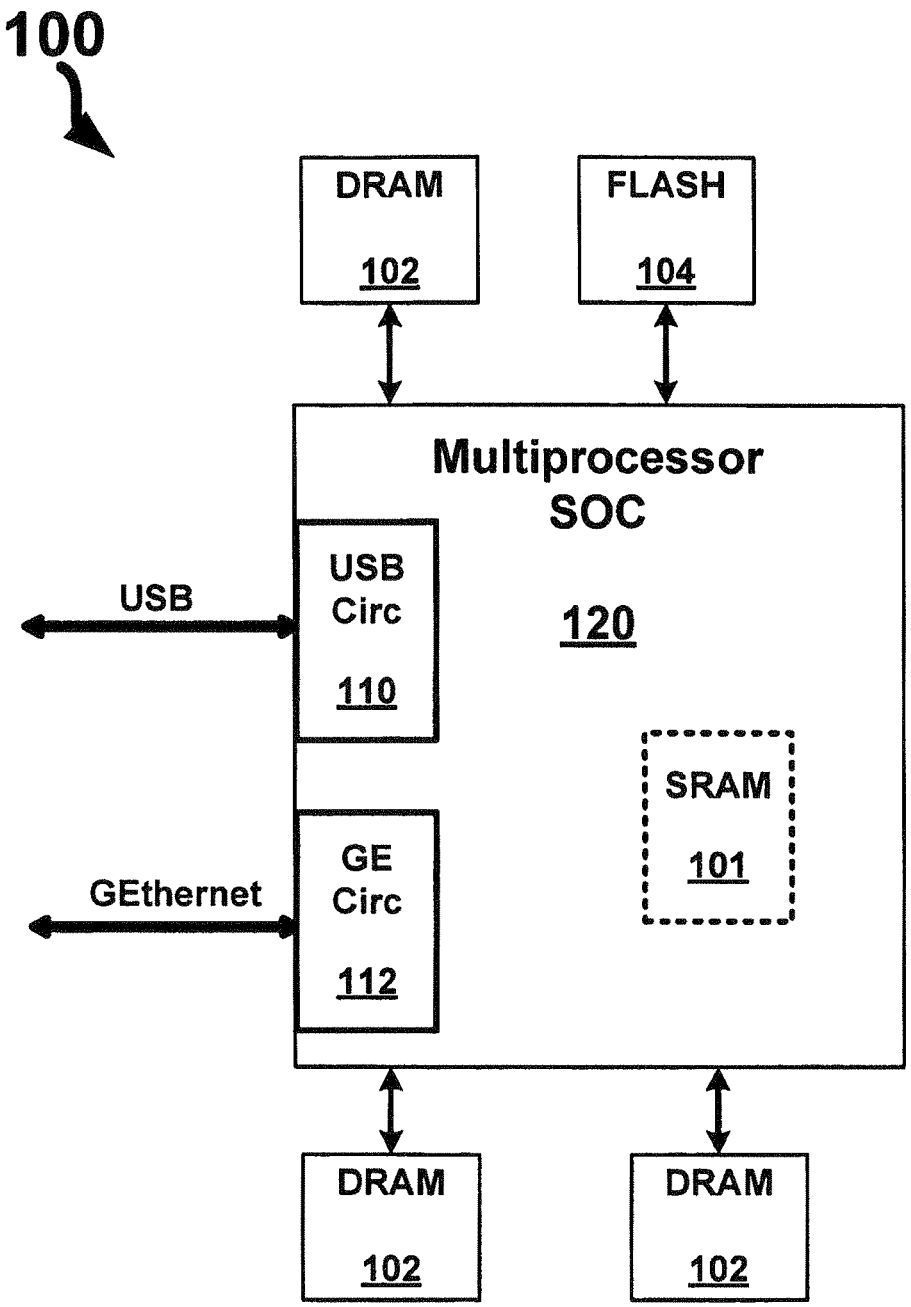
FIG. 1 depicts a functional diagram depicting a traditional processor-memory system based on a multiprocessor and various memory technologies.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Figure 2:
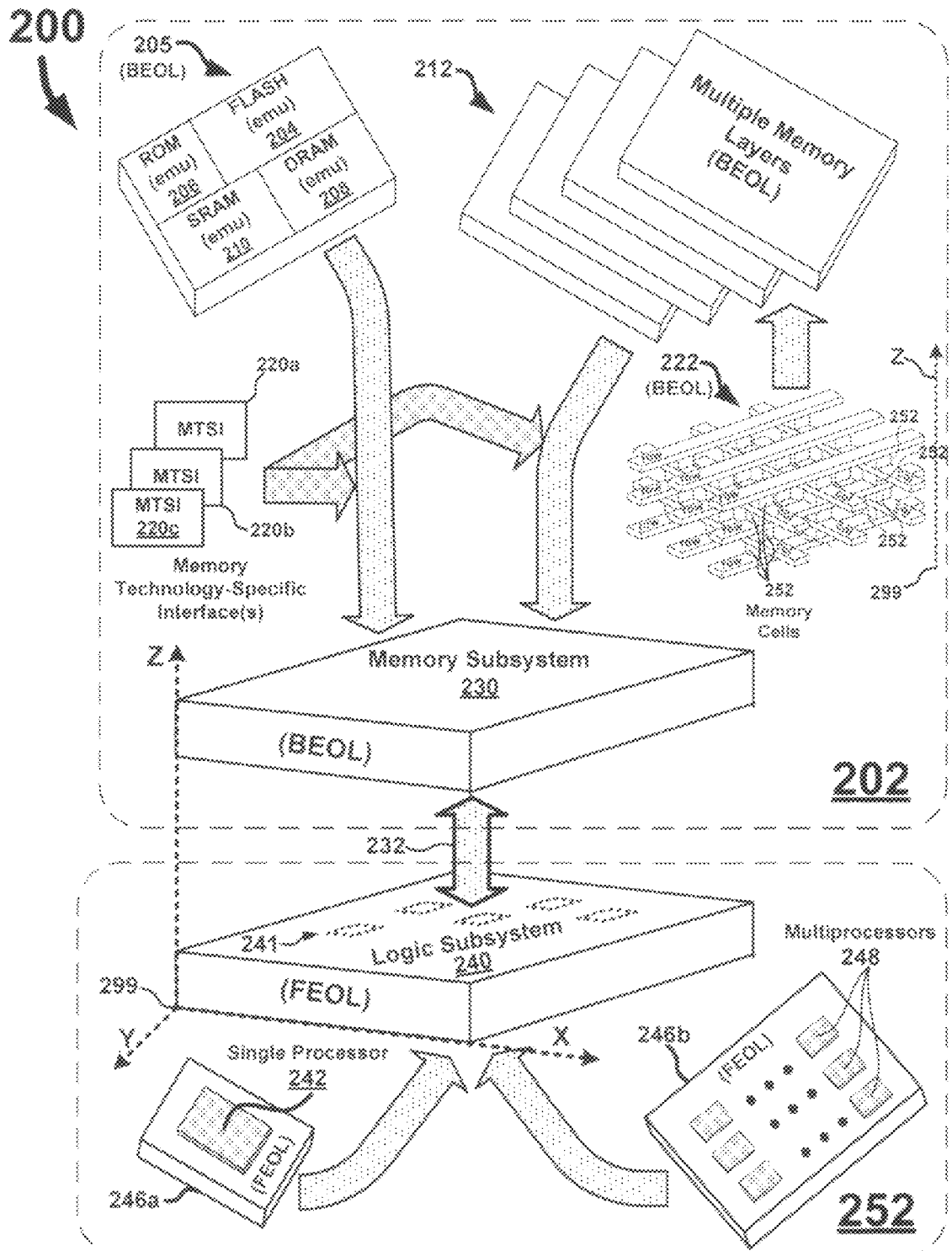
FIG. 2 depicts an exploded diagram of a processor-memory system in accordance with at least one embodiment of the invention.

FIG. 2 depicts an exploded diagram of a processor-memory system 200 in accordance with at least one embodiment of the invention. As shown, processor-memory system 200 includes a memory portion 202 and a logic portion 252 as memory subsystem 230 and logic subsystem 240, respectively, both being communicatively coupled via, for example, trans-layer interconnections 232 operative to electrically couple the logic portion 252 with the memory portion 202. Logic subsystem 240 includes logic configured to at least access memory subsystem 230 to perform data operations (e.g., write or read data). In some cases, logic subsystem 240 can include multiple processors ("multiprocessors") 248 formed on a substrate 246b, whereas logic subsystem 240 can include a single processor 242 formed on substrate 246a in other cases. Alternatively, logic subsystem 240 can include only a silicon wafer (e.g., fabricated FEOL) upon which memory subsystem 230 is formed directly on top of (e.g., BEOL). Regardless, logic subsystem 240 includes one or more subsets of ports 241 configured to communicate different memory technology-specific signals with memory subsystem 230. As used herein, the term "memory technology-specific signal" refers, at least in one embodiment, to signals that conform to a specific memory technology, including but not limited to SRAM, DRAM, ROM, and FLASH memory technologies, for example. Processor-memory system 200 implements these signals to interact with the memory cells of memory subsystem 230 as if those memory cells were formed as a specific memory technology, which is a different memory technology than implemented in memory subsystem 230. As such, memory subsystem 230 is configured to operate as one or more different memory technologies. In one embodiment, memory subsystem 230 can include multiple memory layers 212, which, for example, can be composed of a vertically-stacked arrangement of memory cells in multiple memory layers 212. In at least one embodiment, multiple memory layers 212 exclude a substrate and are formed BEOL upon logic subsystem 240 which can be formed FEOL. Therefore, unlike conventional processor-memory systems (e.g., as depicted in FIG. 1), the processor-memory system 200 requires less board space (e.g., on a pc board) because the integrated circuit package includes the multiple memory layers 212 vertically formed BEOL above the logic subsystem 240 that was previously formed FEOL on a substrate such as a silicon wafer, for example. If three layers of memory are used, the board real estate saved includes the area that would be taken up by three separate conventional memory integrated circuits that would each be mounted to the board and electrically coupled with a conventional logic subsystem such that four integrated circuit chips would be required as opposed to just a single chip for the processor-memory system 200. As used herein, the term "memory technology" refers to, at least in one embodiment, a type of memory characterized by, for example, one or more of the following: the structure of an individual memory cell or transistor, the storage mechanism (e.g., Fowler-Nordheim tunneling), the array architecture, the interface (e.g., NOR or NAND interfaces) for communicating control, data and address signals, and/or other similar characteristics.

In view of the foregoing, a designer can emulate one or more different memory technologies using, for example, any of multiple memory layers 212. As such, memory subsystem 230 can be configured to include variable amounts of "specific use" memory (e.g., cache memory) that is tightly coupled to a specific processor and "general use" memory (e.g., system memory) that is shared across multiple processors, without increasing a die size for substrates 246a and 246b to accommodate memory in those substrates. In particular, increased amounts of "specific use" and "general use" memories can be implemented in the vertically-stacked arrangement (e.g., along the Z direction of X-Y-Z axes 299) of memory cells in multiple memory layers 212, without increasing the dimensions of logic subsystem 240 to accommodate memory cells in the planar direction (e.g., along the X and Y directions of axes 299).

Memory subsystem 230 therefore facilitates memory expansion in the vertical direction (e.g., along the +Z axis) over logic subsystem 240 to add relatively large amounts of memory without the costs of increasing a die size to include memory cells on the substrate of logic subsystem 240. Notably, memory subsystem 230 can implement memory that otherwise would be external to processor-memory system 200, such as external DRAM or FLASH memory. This reduces package dimensions and input/output ("I/O") pins that otherwise would connect to external memories. As memory subsystem 230 can be disposed upon (e.g., fabricated BEOL directly above and in contact with 240) logic subsystem 240, it also reduces power by obviating the need for relatively high-powered drivers that are typically used to access external memories for refreshing DRAM cells, for example. Memory subsystem 230 can also preserve resources, such as board space, that otherwise would be expended to accommodate external memory devices (e.g., external DRAM or FLASH memory devices).

In at least one embodiment, the memory cells of memory subsystem 230 are third dimension memory cells. U.S. patent application Ser. No. 11/095,026, filed Mar. 30, 2005, now published as U.S. Pub. No. 2006/0171200, and entitled "Memory Using Mixed Valence Conductive Oxides," is hereby incorporated by reference in its entirety for all purposes and describes non-volatile third dimensional memory elements that can be arranged in a two-terminal, cross-point memory array. New memory structures are possible with the capability of this third dimensional memory array. In at least some embodiments, a two-terminal memory cell can be configured to change conductivity when exposed to an appropriate voltage drop across the two-terminals. The memory cell can comprise a two-terminal memory element including an electrolytic tunnel barrier and a mixed valence conductive oxide. A voltage drop across the electrolytic tunnel barrier can cause an electrical field within the mixed valence conductive oxide that is strong enough to move oxygen ions out of the mixed valence conductive oxide and into the electrolytic tunnel barrier. When certain mixed valence conductive oxides (e.g., praseodymium-calcium-manganese-oxygen—PCMO perovskites and lanthanum-nickel-oxygen—LNO perovskites) change valence, their conductivity changes. Additionally, oxygen accumulation in certain electrolytic tunnel barriers (e.g., yttrium stabilized zirconia—YSZ) can also change conductivity. If a portion of the mixed valence conductive oxide near the electrolytic tunnel barrier becomes less conductive, the tunnel barrier width effectively increases. If the electrolytic tunnel barrier becomes less conductive, the tunnel barrier height effectively increases. Both mechanisms can be reversible if the excess oxygen from the electrolytic tunnel barrier flows back into the mixed valence conductive oxide. A memory can be designed to exploit tunnel barrier height modification, tunnel barrier width modification, or both. The technology allows for the emulation of other memory technologies by duplicating the interface signals and protocols, while accessing the third dimensional memory array. The third dimensional memory array may emulate other types of memory, providing memory combinations within a single component. To illustrate the functionality of a third dimensional memory element, consider that the third dimensional memory element switches to a low resistive state in response to a first write voltage, and switches to a high resistive state when a second write voltage is applied. In some examples, the first write voltage may be opposite in polarity from the second write voltage. The resistance of the memory element may be adjusted by the voltage differential across the memory element. As such, the two terminals of the memory element may be coupled to one or more variable voltage sources to create a voltage differential across the two terminals. For example, a first terminal of the memory element may be programmed to be a certain voltage between, for instance, +3 Volts and −3 Volts. Further, a second terminal of the memory element may be programmed to be another voltage between, for instance, +3 Volts and −3 Volts. In some embodiments, an electrolytic tunnel barrier and one or more mixed valence conductive oxide structures do not need to operate in a silicon substrate, and, therefore, can be fabricated (e.g., back-end-of-the-line BEOL) above circuitry (e.g., 240) being used for other purposes (e.g., fabricated front-end-of-the-line FEOL). Further, third dimension memory cells in memory subsystem 230 can be produced with identical or equivalent fabrication processes that produce logic subsystem 240. As such, both subsystems can be manufactured in the same or different fabrication plants, or "fabs," to form processor-memory system 200 as an integrated circuit on a single substrate (e.g., the FEOL portion and BEOL portion comprise a unitary die). For example, this enables a manufacturer to first fabricate logic subsystem 240 using a CMOS process in a first fab as part of a front-end-of-the-line (FEOL) process, and then port (e.g., transport) logic subsystem 240 to a second fab at which additional CMOS processing can be used to fabricate multiple memory layers 212 directly on top of logic subsystem 240 as part of a back-end-of-the-line (BEOL) process, whereby the one or more layers of memory are fabricated directly above a substrate (e.g., a silicon wafer) that includes the logic subsystem 240 and its associated circuitry and inter-level interconnect structure (e.g., formed FEOL) for electrically communicating signals between the logic subsystem 240 and the one or more layers of memory. Logic subsystem 240 therefore can be configured to interact with different memory technologies, such as DRAM, SRAM, ROM, and FLASH memories, without fabricating memory subsystem 230 in a different or a more complex fabrication process than is used to produce logic subsystem 240. As such, memory subsystem 230 can be vertically stacked on top of logic subsystem 240 without an intervening substrate.

In at least one embodiment, multiple memory layers 212 are fabricated to arrange the third dimension memory cells in a stacked cross-point array 222. Stacked cross-point arrays can include memory cells that share conductive array lines with memory cells in other layers as depicted in stacked cross-point array 222 or the conductive array lines in each layer can be electrically isolated (e.g., by a dielectric material such as $SiO_2$ or the like) from the conductive array lines in adjacent memory layers (not shown). That is, two-terminal memory elements can be arranged in a cross-point array (e.g., a two-terminal cross-point memory array) such that one terminal is electrically coupled with an X-direction line and the other terminal is electrically coupled with a Y-direction line and data operations to the two-terminal memory element require a potential difference of sufficient magnitude be applied across the conductive array lines the memory cell is positioned between such the potential difference is applied across the two terminals of the memory element. A stacked cross-point array can include multiple cross-point arrays stacked upon one another, sometimes sharing X-direction and Y-direction lines between layers, and sometimes having isolated lines. Both single-layer cross-point arrays and stacked cross-point arrays can be arranged as third dimension memories Memory arrays using third dimension memory cells can be implemented using layers of memory elements that arrange data in blocks or sub-blocks. By utilizing third dimension memory, driving voltage requirements may be met by using multiple, relatively smaller charge pumps. Further, multiple, simultaneous accesses of memory elements in a memory array can be performed. While various types and designs of charge pump circuits may be used, the implementation of multiple, smaller charge pumps in a third dimension memory allows for die size to be reduced while improving chip capabilities, including faster access times for performing multiple, simultaneous programmable sequences.

Processor-memory system 200 further includes one or more memory technology-specific interfaces ("MTSIs") 220 configured to convert memory technology-specific signals for different memory technologies into signals that can interact with the third dimension memory cells of multiple memory layers 212. Examples of different memory technologies include FLASH memory, DRAM, SRAM, ROM, and other equivalent memory technologies. Memory technology-specific interfaces 220, therefore, can configure one or more layers of multiple memory layers 212 to behave as any of the following different memory technologies: a DRAM technology, a SRAM technology, a FLASH memory technology, a ROM technology, an EEPROM technology, or any other memory technology. As used herein, the term "emulated" memory technology refers to, at least in one embodiment, one or memory cells (e.g., in multiple memory layers 212) that behave as if formed in a different memory technology.

Note that, in some embodiments, memory technology-specific interfaces 220 can be formed as part of memory subsystem 230, whereas memory technology-specific interfaces 220, in other embodiments, can be either formed as part of logic subsystem 240 or distributed throughout multiple memory layers 212.

To illustrate the functionality of memory technology-specific interfaces 220, consider that technology-specific interface 220a is configured to convert DRAM control, data and address signals into signals for interacting with a first subset of multiple memory layers 212, and that technology-specific interface 220b is configured to convert FLASH memory control, data and address signals into signals for interoperating with a second subset of multiple memory layers 212. In this example, the first subset of multiple memory layers 212 operates as a DRAM, and, thus, constitutes an emulated DRAM. Similarly, the second subset operates as a FLASH memory. Accordingly, memory subsystem 230 provides logic subsystem 240 with memory cells that emulate DRAM and FLASH memory technologies in one or more multiple memory layers 212, such that the memory cells emulating DRAM are formed substantially coincident to memory cells emulating FLASH memory. Thus, logic subsystem 240 can generate DRAM signals and FLASH memory signals to interact with portions of multiple memory layers 212 operating as DRAM and FLASH memory, respectively. In some embodiments, memory technology-specific interfaces 220 are omitted and subsets of ports 241 can be configured to interact with third dimension cells. In this case, logic subsystem 240 is configured to interact with third dimension memory technology rather than different memory technologies.

Processor-memory system 200, according to one embodiment, can include one or more memory technology-specific interfaces 220 (e.g., 220a, 220b, 220c) that are configured to adapt memory technology-specific signals for one or more different memory technologies emulated in one layer 205. Specifically, these signals can be adapted to interact with at least one layer 205 that includes operationally different portions of third dimension memory cells, whereby each operationally different portion can function as a different memory technology. The layer 205 and its associated memory can be fabricated BEOL; whereas, the memory technology-specific interfaces 220 can be fabricated FEOL. In the example shown, layer 205 includes a first portion ("FLASH (emu)") 204 configured to emulate FLASH memory, a second portion ("ROM (emu)") 206 configured to emulate ROM, a third portion ("DRAM (emu)") 208 configured to emulate DRAM, and a fourth portion ("SRAM (emu)") 210 configured to emulate SRAM. In various embodiments, layer 205 can be either the only layer (e.g., a single layer of memory) in memory subsystem 230, or one of multiple memory layers 212. The single layer of memory or the multiple layers of memory can include a single cross-point memory array or a plurality of cross-point memory arrays formed in each layer. Further, portions 204, 206, 208, and 210 can be distributed in any of multiple memory layers 212. Note that while logic subsystem 240 can be formed on a first substrate as a first integrated circuit, with a memory subsystem 230 formed thereupon as a second integrated circuit, other embodiments need not be so limiting.

Figure 3:
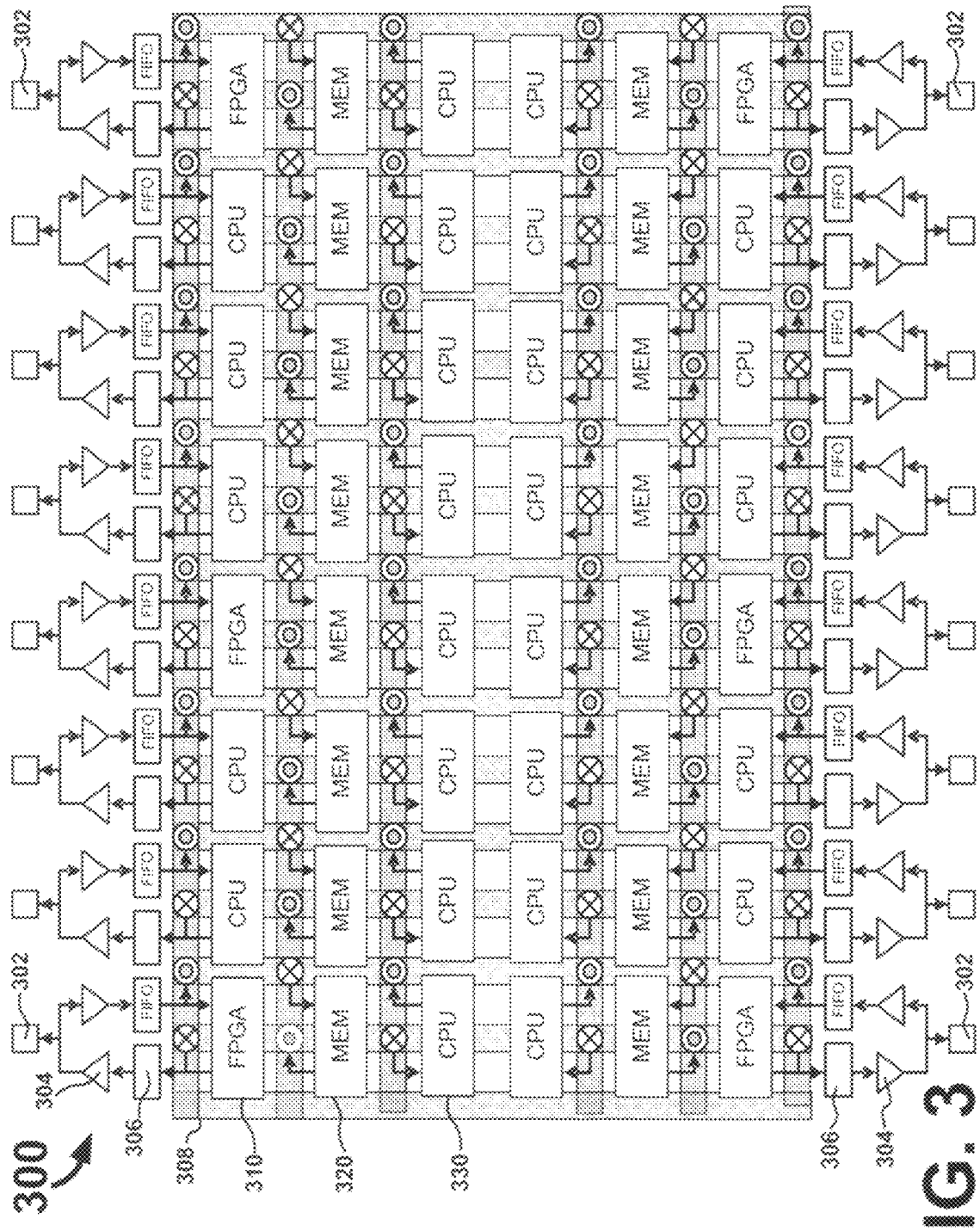
FIG. 3 depicts a top plan view of multiprocessor chip of FIG. 1 formed as a system-on-a-chip ("SoC") upon which multiple layers of memory can be formed, according to at least one embodiment.

FIG. 3 depicts a top plan view of multiprocessor chip of formed as a system-on-a-chip ("SoC") upon which multiple layers of memory can be formed, according to at least one embodiment. Specifically, SoC 300 can include multiple central processing units ("CPUs") 330 and/or field programmable gate arrays ("FPGAs") 310, both of which are configured to execute instructions as multiple processors. Also, SoC 300 is shown to include regions 320 at which memory can be formed to serve a respective processor. Further, SoC 300 includes input and output terminals 302, drivers 304, buffers 306 (e.g., first-in, first out buffers, or "FIFO" buffers), and an internal bus 308 for exchanging data among memory blocks. In at least one embodiment, known fabrication processes can be used to form CPUs 330, FPGAs 310 and the memory that constitute regions 320 (or an aggregation thereof). Note that while memory regions ("MEM") 320 are depicted conceptually as part of a common plane with CPUs 330, this need not be the case. For example, regions 320 can implement third dimensional memory cells that are formed (e.g., fabricated BEOL) in multiple layers of memory, which can be stacked (not shown) vertically upon (e.g., fabricated above) CPUs 330 (e.g., fabricated FEOL). In a specific embodiment, CPUs 330 represent processors 248 of FIG. 2 formed in logic layer 240 and regions of memory can be implemented in multiple memory layers 212 of FIG. 2. A specific implementation is described below in regards to FIG. 8.

FIGS. 4A to 4D are functional block diagrams depicting examples of memory technology-specific interfaces that can be fabricated FEOL and third dimension memory (e.g., either a single layer or multiple layers) that can be fabricated BEOL above their respective FEOL memory technology-specific interfaces, according to various embodiments of the invention. As third dimension memory cells can be written to and read from at speeds comparable to, or faster than, SRAMs, one or more layers 410 can emulate SRAM technology. For example, the third dimension memory cells can have access times equivalent to 8 to 12 nanoseconds, or less. Also, one or more layers 410 of third dimension memory cells can provide for a "nonvolatile" SRAM, which can conserve power that otherwise would be used to maintain data in a conventional SRAM. Further, third dimension memory elements (or cells) can emulate SRAM memory cells without NAND and NOR gates as memory elements. This increases the density of the emulated SRAM. Typically, SRAM technologies use four to six transistors operating as flip flops. In one embodiment, memory technology-specific interfaces include an interface controller and optional interface buffers. In a specific embodiment, interface controller includes logic formed in a logic subsystem and interface buffers formed in a memory subsystem.

Figure 4A:
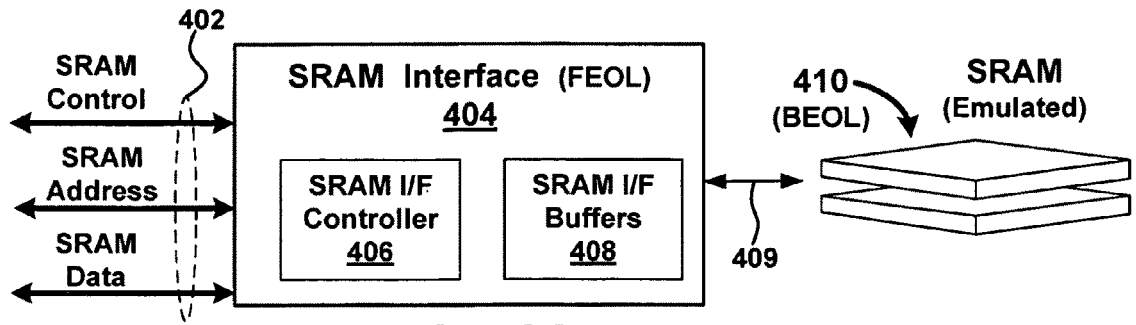
FIGS. 4A to 4D are functional block diagrams depicting examples of memory technology-specific interfaces, according to various embodiments of the invention.

FIG. 4A depicts a memory technology-specific interface as an SRAM interface 404 that is configured to use one or more layers 410 of third dimension memory cells to emulate SRAM memory technology. In particular, SRAM interface 404 operates to convert SRAM signals 402 into signals 409 for interacting with one or more layers 410. SRAM signals 402 can include SRAM control signals, such as a chip select and write enable signals (neither are shown), address signals representing an address and data signals representing data either written into or read from one or more layers 410.

SRAM interface 404 includes an SRAM interface ("I/F") controller 406 and optional SRAM interface ("I/F") buffers 408. SRAM interface controller 406 can include logic configured to use SRAM control signals to determine whether layers 410 of the emulated SRAM memory cells are to be written or read. An example of such logic includes decode logic for determining whether to write a byte of memory based on a chip select signal and a write enable signal. SRAM interface controller 406 can optionally include additional logic that is configured to, for example, coordinate the conversion of SRAM data and address signals into data and address signals 409 that are useable by memory arrays of third dimension memory cells in layers 410. As such, the additional logic can convert addresses in two-dimension memory space into addresses for three-dimension memory space. SRAM interface buffers 408, which are optional, can include temporary storage (e.g., using third dimension memory cells) for converting serially transmitted address and/or data signals, if applicable, into parallel address and/or data signals, or vice versa. In view of the foregoing, SRAM interface 404 enables layers 410 to emulate a cache memory for each of multiple processors 248 of FIG. 2, at any of the vertically-stacked layers of memory. This saves memory array space that otherwise would contribute to an increase in die size.

Figure 4B:
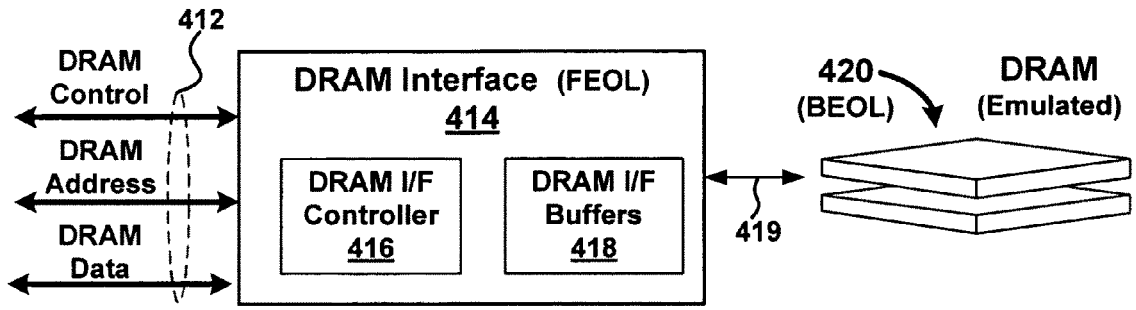

FIG. 4B depicts a memory technology-specific interface as a DRAM interface 414 that is configured to use one or more layers 420 of third dimension memory cells to emulate DRAM memory technology. In particular, DRAM interface 414 operates to convert DRAM signals 412 into signals 419 for interacting with one or more layers 420. DRAM signals 412 can include DRAM control signals, such as column address strobe ("CAS"), row address strobe ("RAS"), and write enable signals (none are shown), address signals representing an address, and data signals representing data either written into or read from one or more layers 420.

As the densities of third dimension memory cells comparable to, or higher than, DRAMs, one or more layers 420 can emulate DRAM technology. One or more layers 420 of third dimension memory cells can provide a "nonvolatile" DRAM, which can conserve power that otherwise would be used to refresh data, such as in refresh cycles common with conventional DRAM. Therefore, processor-memory system 200 will not lose its data if system clocks are stopped to save power in, for example, a sleep mode. As such, processor-memory system 200 can offer emulated DRAM that can conserve power when idle. As third dimension memory elements (or cells) can emulate DRAM memory cells internal to processor-memory system 200, this reduces external device and board space, as well as pin count.

DRAM interface 414 includes a DRAM interface ("I/F") controller 416 and optional DRAM interface ("I/F") buffers 418. DRAM interface controller 416 can include logic configured to use DRAM control signals to determine whether layers 420 in the emulated DRAM memory cells are to be written or read. An example of such logic includes a command state machine configured to decode commands and perform a memory-related function. DRAM interface controller 416 can include additional logic configured to coordinate the conversion of DRAM data and address signals into data and address signals that are useable by memory arrays of third dimension memory cells in layers 420. For example, DRAM interface controller 416 can control the conversion of serially-transmitted commands, data and address signals on a common bus into parallel address and data signals for performing a memory operation with layers 420. Further, DRAM interface controller 416 accommodates relatively longer access times associated with DRAM memory technologies. For example, access times in some DRAM technologies can be about 50 to 60 nanoseconds. Note that a stacked memory technology, such as third dimensional memory, can be configured to emulate DRAM, and, as such, the stacked memory technology can enable a user to have an emulated DRAM that either operates faster than typical DRAMs, or can—through logic (e.g., registered logic)—operate at equivalent speeds of known DRAMs.

DRAM interface buffers 418 may include temporary storage (e.g., using third dimension memory cells in layers 420) for converting serially transmitted address and/or data signals, if applicable, into parallel address and/or data signals, or vice versa. In at least one instance, known logic registers may also be used. For example, DRAM interface buffers 418 can latch a serially-transmitted address until it is needed. As another example, if layers 420 are to emulate a DDR SDRAM, DRAM interface buffers 418 can be used to convert serial data signals on rising and falling clock edges to a parallel data signals for layers 420. In view of the foregoing, DRAM interface 414 enables layers 420 to emulate system memory for general use by multiple processors 248 of FIG. 2, at various vertically-stacked layers of memory. This, too, saves memory array space that otherwise would contribute to an increase in die size. In various embodiments, memory cells emulating DRAM can share space in the same layer as logic subsystem 240, or in any plane above that subsystem.

Figure 4C:
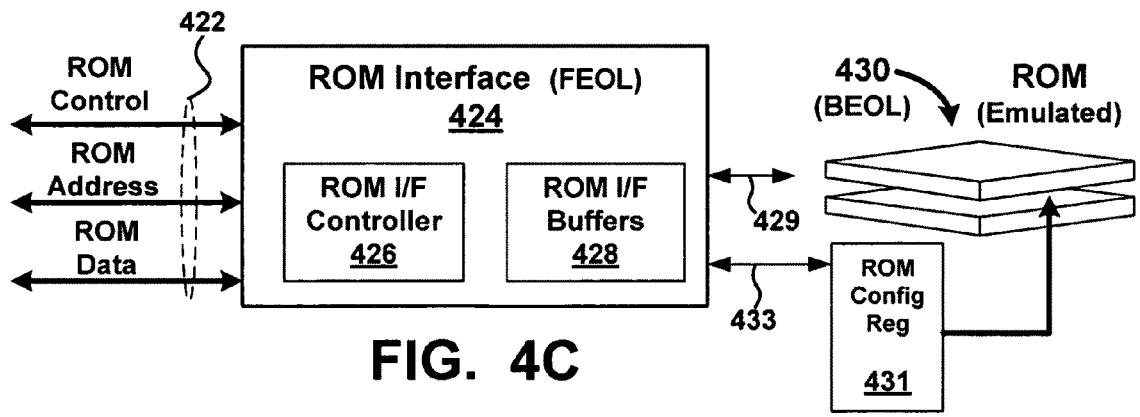

FIG. 4C depicts a memory technology-specific interface as a ROM interface 424 configured to use one or more layers 430 of third dimension memory cells to emulate ROM memory technology. In particular, ROM interface 414 operates to convert ROM signals 422 into signals 429 for interacting with one or more layers 430. ROM signals 402 can include ROM control signals, address signals, and data signals representing data either written into or read from one or more layers 430.

ROM interface 424 includes a ROM interface ("I/F") controller 426 and optional ROM interface ("I/F") buffers 428, both of which can be configured to operate in a similar manner as those described in FIGS. 4A and 4B. ROM interface 424 is configured further to communicate configuration signals 433 to a ROM configuration register ("ROM Config Reg") 431, which is used to convert third dimension memory cells in one or more layers 430 from being writeable to being "read only." In particular, ROM configuration register 431 stores one or more bits indicating whether to enable "write protect" functionality to disable writes (i.e., write voltages) to one or more layers 430, thereby making it incapable of future writes after being programmed with, for example, a boot ROM code. In operation, ROM interface 424 inspects the contents of ROM configuration register 431 to determine whether to disable a write signal as a ROM control signal in signals 422. Initially, ROM configuration register 431 stores bits indicating that one or more layers 430 can be programmed. But after ROM configuration register 431 is configured to disable writes, the third dimension memory cells can behave as a "read only" memory. In various embodiments, memory elements of ROM configuration register 431 can be implemented in third dimension memory cells, such as within or without one or more layers 430, or in any other memory technology, the memory elements being coupled to the logic (i.e., register logic) for ROM configuration register 431. Such logic can be formed in the logic layer.

As third dimension memory cells are nonvolatile in nature, one or more layers 430 can emulate ROM technology. As such, one or more layers 430 can store boot code that otherwise is typically stored in a ROM chip having a separate substrate. By storing boot code internal to a processor-memory system, as described herein, the time to fetch and execute the boot code can be decreased, thereby reducing the time to boot an application. In addition, using one or more layers 430 to emulate ROM memory cells can also reduce the number of external devices, board space and pin count.

Figure 4D:
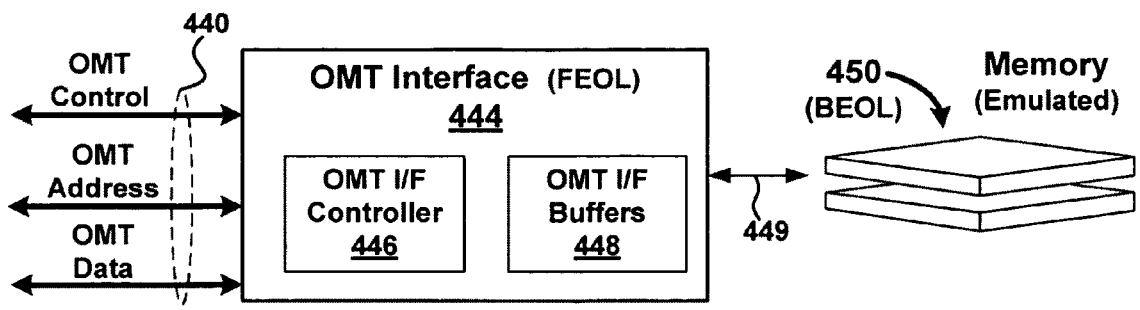

FIG. 4D depicts a memory technology-specific interface as an "other memory technology" ("OMT") interface 444 configured to use one or more layers 450 of third dimension memory cells to emulate any other type of memory technology, such as FLASH memory, EEPROM, and the like, as well as new memory types as they become available. In particular, OMT interface 444 operates to convert OMT signals 440 into signals 449 for interacting with one or more layers 450. OMT signals 440 can include OMT control signals, address signals, and data signals. OMT interface 444 includes an OMT interface ("I/F") controller 446 and optional OMT interface ("I/F") buffers 448, both of which can be configured to operate in a similar manner as those described in FIGS. 4A and 4B.

In one embodiment, one or more layers 450 can emulate FLASH memory. In this case, OMT interface 444 operates to convert FLASH memory-specific signals as OMT signals 440 into signals 449 for interacting with one or more layers 450. In at least one instance, the third dimension memory cells can emulate the density and nonvolatility of FLASH memory. But one or more layers 450 do not require the erase cycles (e.g., an erase operation) as does FLASH memory, thereby eliminating the time that is otherwise used to erase FLASH memory. Hence, a FLASH interface composed of OMT interface 444 can be configured to operate at least one of layers 450 as a FLASH memory without a write cycle requiring a preceding erase cycle. Since FLASH memory emulation by one or more layers 450 does not require erase cycles, the emulated FLASH memory can implement back-to-back writes with no special preconditioning. As such, write operations to the emulated FLASH memory are fast and offer an improvement in performance. Further, the elimination of erase cycles also eliminates a need for a FLASH file manager, thereby obviating a need for FLASH file management software. Thus, one or more layers 450 can operate as FLASH memory without a FLASH file system. In one embodiment, OMT interface 444 is configured to emulate a NOR-type interface by adapting memory-specific signals for a NOR-type interface for use with layers 450. A NOR-type interface is typically used with FLASH memory having a NOR memory structure. In another embodiment, OMT interface 444 is configured to emulate a NAND-type interface to emulate NAND-based FLASH memory. Note that emulation hardware that constitutes a memory technology-specific interface can be configured to emulate the inherent functions of a FLASH memory. For example, if an erase cycle is desired for compatibility reasons, the memory technology-specific interface can be configured to emulate the erase function, by inserting time delays, rewriting the data to zeroes (e.g., an erase state), or using any other like technique for emulating a FLASH memory erase.

In another embodiment, one or more layers 450 can emulate EEPROM memory, serial or otherwise. In this case, OMT interface 444 operates to convert EEPROM memory-specific signals as OMT signals 440 into signals 449 for interacting with one or more layers 450. In at least one instance, the third dimension memory cells can emulate the density and non-volatility of EEPROM memory. But one or more layers 450 perform write operations at lower voltages than EEPROM write operations, thereby obviating a need for applying higher voltages to the third dimension memory cells therein. This eliminates a need for special high voltage charge pumps as well as ASIC fabrication processes that otherwise are conventionally used to form EEPROM cells in a logic subsystem. Also, the third dimension memory cells obviate a need for large capacitors for the voltage pumps, which typically consume surface area of a substrate. For at least the foregoing reasons, emulating EEPROM memory with one or more layers 450 can reduce die area and can improve the reliability of the emulated EEPROM by omitting higher write voltages that typically subject EEPROM cells to stress.

Consider that one or more layers 450 can be implemented as a serial EEPROM for booting a device implementing one or more processors and communications buses and/or ports. As such, one or more layers 450 can be programmed to store parameters for configuring, for example, bus settings, polarity inversion, and I/O pin usage. For example, one or more layers 450 can store configuration parameters for configuring a high-speed bus, such as a PCI, a PCIe, or a HyperTransport bus, by storing bus configuration register values in third dimension memory cells. Storing the parameters internal to a processor-memory system can reduce the time to boot an application, as compared to externally-stored configuration parameters.

Figure 5:
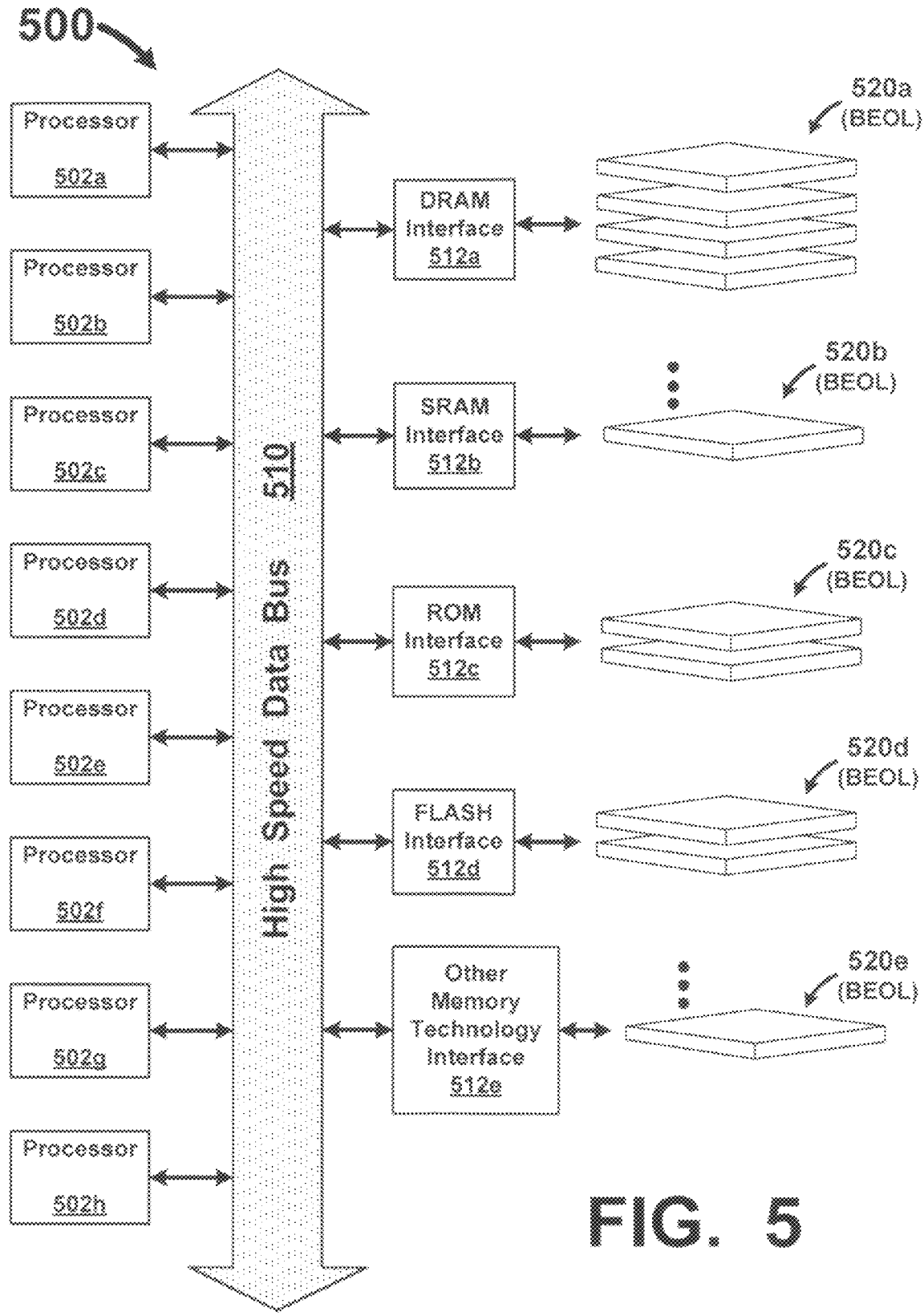
FIG. 5 depicts a diagram of a processor-memory system in accordance with at least one embodiment of the invention.

FIG. 5 depicts a diagram of a processor-memory system 500 in accordance with at least one embodiment of the invention. As shown, processor-memory system 500 includes multiple processors 502a to 502h coupled via a high-speed data bus 510 to any number of subsets 520a to 520e of multiple memory layers. Processor-memory system 500 also includes a DRAM interface 512a, an SRAM interface 512b, a ROM interface 512c, a FLASH interface 512d, and one or more other interfaces collectively represented as other memory technology interface 512e. DRAM interface 512a is configured to convert signals specific to DRAM memory technologies (i.e., "DRAM signals") received from any of multiple processors 502a to 502h into signals to cause third dimension memory cells in one or more layers 520a to behave as DRAM memory cells. SRAM interface 512b, ROM interface 512c, and FLASH interface 512d are configured to adapt memory technology-specific control, address and data signals to cause third dimension memory cells in one or more layers 520b, 520c, and 520d to respectively behave as memory cells of SRAM, FLASH memory, and ROM memory technologies. The third dimension memories 520a-520e can be fabricated BEOL above FEOL fabricated processors 502a-502h and/or interfaces 512a-512e.

In various embodiments, high-speed data bus 510 is configured to facilitate data transfers between a memory subsystem including memory layers 520a to 520e, whereby the data transfers can be used by one or more multiple processors 502a to 502h to, for example, emulate a communications port. High-speed data bus 510 can be a peripheral component interconnect ("PCI")-based data bus, such as PCI Express, as maintained by the PCI Special Interest Group of Beaverton, Oreg. Or, high-speed data bus 510 can be a HyperTransport-based data bus, such as set forth by HyperTransport 3.0, as maintained by the HyperTransport Technology Consortium of Sunnyvale, Calif. Note that high-speed data bus 510 is not limited to PCI Express or HyperTransport, and, therefore, can be implement as any type of high-speed bus for interconnecting multiple processors 502a to 502h to any layer of a memory subsystem. For example, high-speed data bus 510 can implement bus architecture functionality equivalent to a IBM CoreConnect™ bus architecture developed by IBM, Corp., or an Advanced Microcontroller Bus Architecture ("AMBA") developed by Advanced RISC Machines Limited ("ARM Ltd").

Further, high-speed data bus 510 can be implemented in either a base layer of the logic subsystem, or as one or more vertical interconnections passing through layers 520a to 520e, or any combination thereof. In one embodiment, high-speed data bus 510 is implemented, in whole or in part, as trans-layer interconnections that are configured to couple subsets of memory ports to one or more of memory layers 520a to 520e. It should be pointed out that the vertically stacked memory operates the same way for each memory type and that the memory controller logic converts various interface protocols to a signal format for data operations on third dimensional memory. Emulating various interfaces is anticipated as many macro blocks such as DRAM controllers have been designed. Using macro blocks can reduce development time as they are drop in macro blocks. Logic can be saved if all memory was accessed as third dimensional memory. This would save logic, but may add to the design time. The SRAM type control would be the closest to optimized third dimensional memory. For example, SRAM does not require a refresh operation as is the case with DRAM; therefore, the RAS and CAS signal protocols of DRAM are not required. It is anticipated that direct third dimensional memory will be used in future electronic systems as this technology becomes mainstream and people design systems that are optimized to use third dimensional memory. Accordingly, future systems can be designed to use third dimensional memory in a non-emulation mode for data storage needs including but not limited to main memory, registers, cache memory, scratch pads, buffer memory, application specific memory such as FIFO's, and embedded memory, just to name a few.

Figure 6:
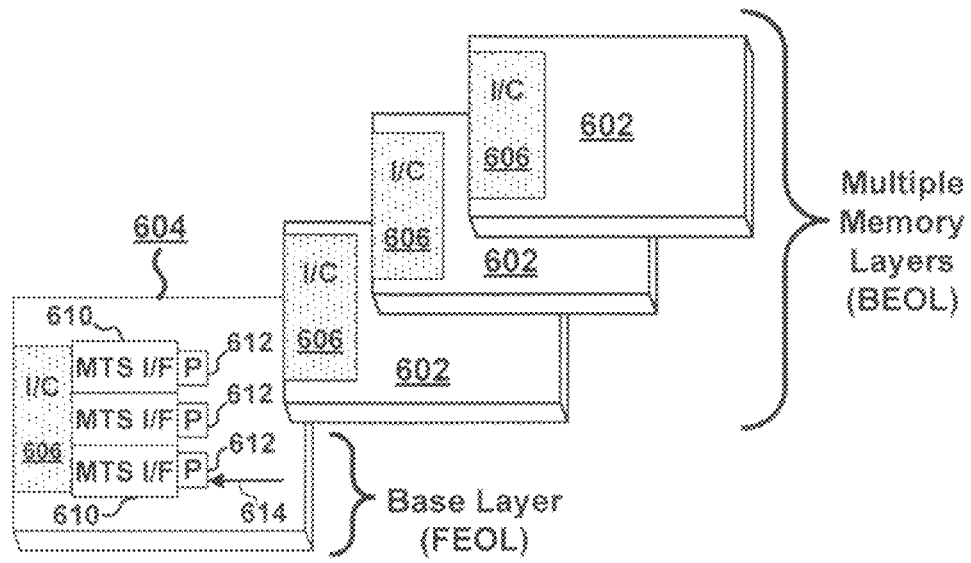
FIG. 6 depicts a block diagram depicting an example of implementing memory technology-specific interfaces, according to an embodiment of the invention.

FIG. 6 depicts a block diagram depicting an example of implementing memory technology-specific interfaces, according to an embodiment of the invention. FIG. 6 depicts multiple memory layers 602 being formed (e.g., fabricated BEOL) in relation to a base layer 604 (e.g., fabricated FEOL). Trans-layer interconnections ("I/C") 606 can include any number of conductors operative to facilitate electrical communication between multiple memory layers 602 and base layer 604. In one embodiment, trans-layer interconnections 606 can include vias formed during a fabrication process. In this example, memory technology-specific interfaces 610 can be formed in base layer 604 (e.g., CMOS circuitry fabricated FEOL). In a specific embodiment, the planar dimensions of base layer 604 can increase to accommodate the interfaces. The increase in size, however, is less than if the memory cells in multiple memory layers 602 are implemented in base layer 604. Note that FIG. 6 also depicts subsets of ports ("P") 612 configured to communicate memory technology-specific signals 614 to, for example, memory technology-specific interfaces 610. Note, too, that subsets of ports 612 can be distributed throughout base layer 604 and multiple memory layers 602.

Figure 7:
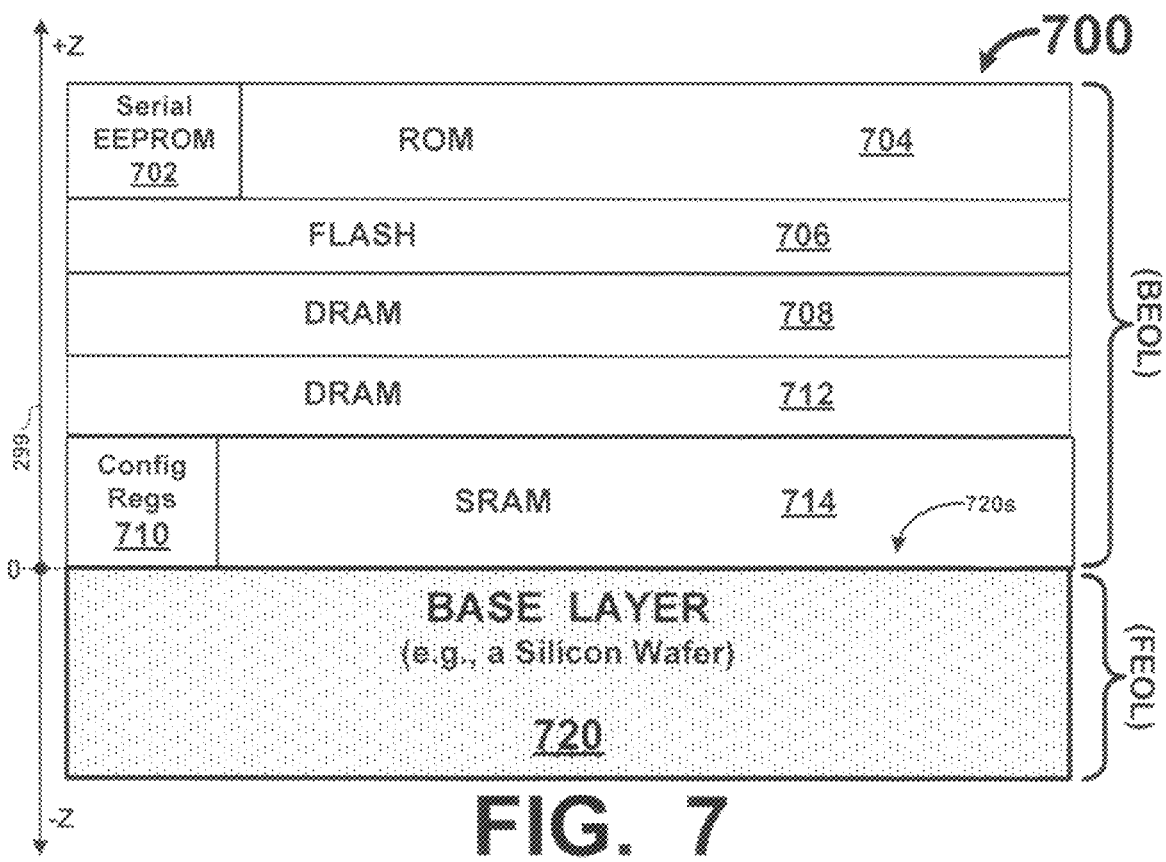
FIG. 7 depicts a cross-section view of an example of a memory subsystem, according to one embodiment of the invention.

FIG. 7 depicts a cross-section view of an example of a memory subsystem, according to one embodiment of the invention. Cross-sectional view 700 depicts multiple memory layers being vertically disposed (e.g., fabricated BEOL above and in contact with upper surface 720s of FEOL layer 720) above or on a base layer 720, which can constitute a logic subsystem and/or a semiconductor substrate (e.g., a silicon—Si wafer). Cross-sectional view 700 can be of a die singulated (e.g., sawed or cut from a wafer) from a wafer, where the die includes the FEOL circuitry portion 720 formed along the −Z axis and the BEOL memory portions 702-714 formed along the +Z axis. Multiple memory layers include a first layer having a first subset 702 and a second subset 704 of third dimension memory cells operable to emulate a serial EEPROM and a ROM, respectively. A second layer 706 includes third dimension memory cells operable to emulate a FLASH memory ("FLASH"), whereas a third layer 708 and a fourth layer 712 include third dimension memory cells operable to emulate DRAM. A fifth layer includes a first subset 710 and a second subset 714 of third dimension memory cells that are operable to emulate configuration register ("Config Regs") 710 and an SRAM 714, respectively. In other embodiments, the multiple memory layers shown in cross-section view 700 can include more or fewer layers than as depicted in FIG. 7, and can include other types of memory technologies.

Figure 8:
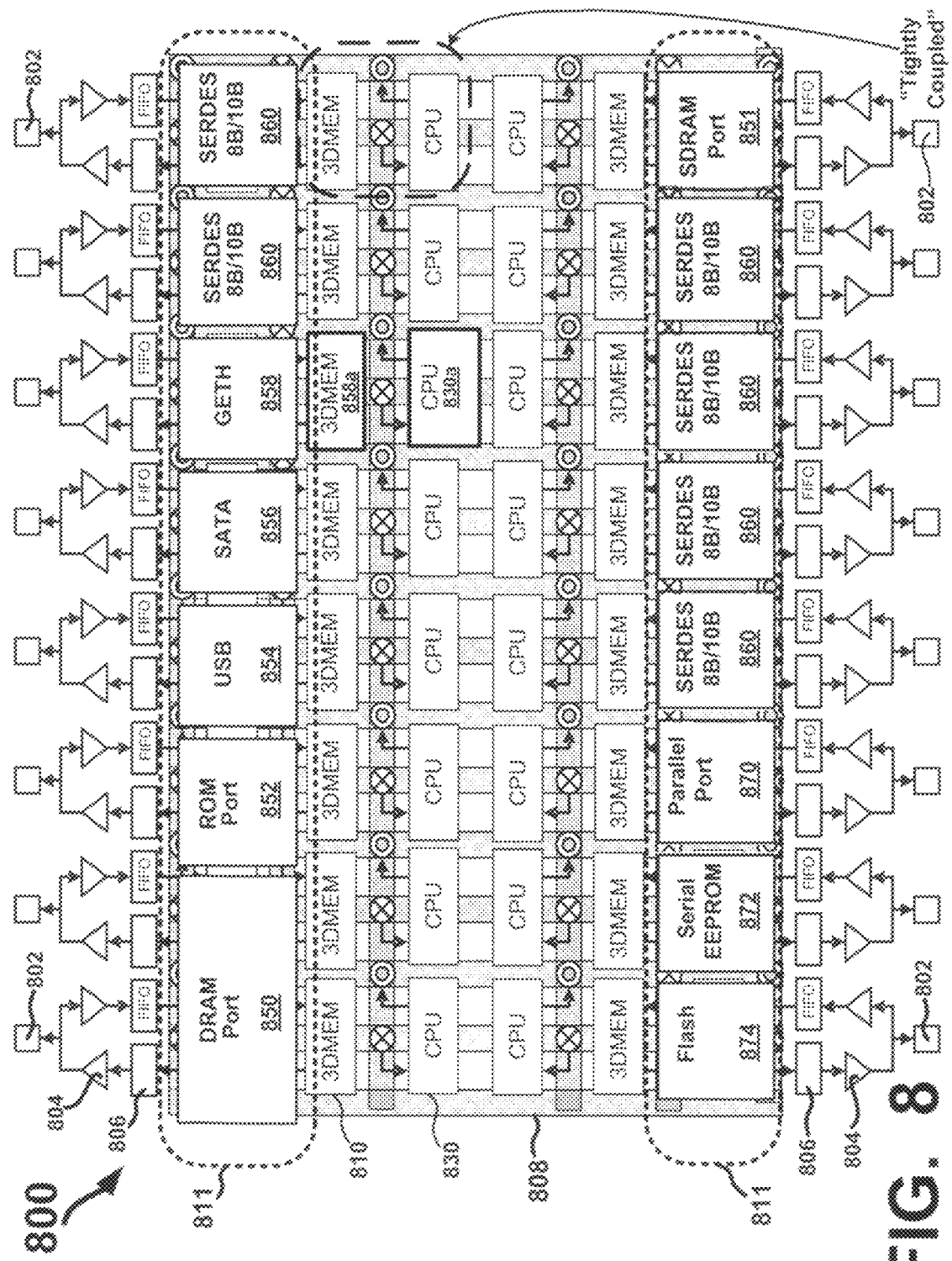
FIG. 8 depicts an example of a multiprocessor chip formed as a process-memory system that includes third dimension memory, according to one embodiment of the invention.

FIG. 8 depicts an example of a multiprocessor chip 800 formed as a process-memory system that includes third dimension memory, according to one embodiment of the invention. Multiprocessor chip 800 can include multiple processing units ("CPUs") 830 configured to execute instructions as multiple processors. While not shown, one or more central processing units 830 can be composed of field programmable gate arrays ("FPGAs"). FIG. 8 depicts multiprocessor chip 800 including blocks of third dimension memory ("3DMEM") 810 that are tightly coupled to a respective processing unit 830. Multiprocessor chip 800 also includes input and output terminals 802, drivers 804, buffers 806 (e.g., first-in, first out buffers, or "FIFO" buffers), and an internal high-speed bus 808 for exchanging data between CPUs 830 and blocks of third dimension memory ("3DMEM") 810. As described above, the third dimension memory ("3DMEM") 810 can be fabricated BEOL on top of FEOL fabricated circuitry such as the CPU's 808 and/or other non-memory circuitry depicted in FIG. 8.

In at least one embodiment, a block of third dimension memory 810 can be programmed with instructions, that when executed, causes a processing unit 830 to perform a specific function as a function block 811. In the example depicted in FIG. 8, processing unit 830 and a block of third dimension memory 810 can be combined to emulate an external port for communicating externally with multiprocessor chip 800. As such, blocks of third dimension memory 810 can be used to facilitate the use of processing units 830 to emulate communication ports rather than implementing dedicated, specialized circuitry that is relatively inflexible in its ability to vary the type of communications port the circuitry can emulate.

Examples of processing units 830 include FPGA structures operating at speeds faster than 1 GHz, as well as other high-speed RISC processors. Examples of emulated communications ports include an emulated USB port 854, an emulated Gigabit Ethernet ("Geth") port 858, an emulated SATA or eSATA port 856, an 8B/10B Serializer/Deserializer ("SERDES") port 860, an emulated DRAM port 850 to access external DRAM, an emulated SDRAM port 851, an emulated FLASH memory port 874, an emulated ROM port 874 for accessing external ROM, an emulated serial EEPORM port 872 for accessing external EEPROM, an emulated parallel port 870, and any other type of communications port as an I/O port. As such, a process-memory system such as multiprocessor chip 800 requires neither a specialized circuit for implementing any of the above-mentioned ports, nor a specific fabrication process (e.g., an ASIC fabrication process) for embedding such a specialized circuit in a logic subsystem. While in some embodiments, blocks 811 providing specific functions (e.g., the emulated communications ports) can be implemented in hardware (as logic circuitry), in other embodiments, the specific functioning blocks can be formed by stacking (not shown) a block of third dimension memory 810 on top of a processing unit 830. A relatively high-speed compute block, such as CPU 830, can emulate hardware through software loads in third dimensional memory, such as 3DMEM 810, which can be formed BEOL above a corresponding FEOL processing core, or CPU 830. For example, an Ethernet port, such as emulated Gigabit Ethernet port 858, may be composed of a processor block (e.g., a CPU 830a) that is operating in association with a third dimensional memory (e.g., 3DMEM 858a) with software loaded therein to emulate the Ethernet controller functionality. Further, the block of third dimensional memory 858a can be physically formed in a layer (not shown) that is above the layer in which CPU 830a is formed. In an alternate embodiment, a designer can configure a block 811 to behave as an FPGA (not shown), where the third dimension memory (e.g., 3DMEM 858) can be formed BEOL on top the FEOL FPGA logic. Then, the memory being used to configure the functionality of the FPGA block to operate in a desired manner.

Note that while FIG. 8 depicts blocks of third dimension memory 810 being formed in the same layer that includes multiple processor units 810, the logic portion of multiprocessor chip 800 can be depicted by block 810. As such, memory array composed of third dimensional memory cells, for example, can be vertically connected to this logic and can reside in one of the logic planes (not shown) (e.g., fabricated BEOL above the logic planes). For example, a block of third dimension memory 810 can be formed (e.g., BEOL) above a corresponding processor, or CPU 830, and any memory logic formed (e.g., FEOL) in the logic layer. In some cases, some of the memory planes can be divided into multiple sub-planes, each of which can be a block of third dimension memory 810.

Embodiments of the invention can be implemented in numerous ways, including as a system, a process, an apparatus, or a series of program instructions on a computer readable medium such as a computer readable storage medium or a computer network where the program instructions are sent over optical or electronic communication links. In general, the steps of disclosed processes may be performed in an arbitrary order, unless otherwise provided in the claims.

Memory devices and systems implementing non-volatile third dimension memory arrays can reduce die size, allow for reduced power requirements, and increased accesses for programmable sequences. One example of a "third dimension memory" is a memory that is fabricated above other circuitry components, which can include a silicon substrate, polysilicon layers and, typically, metallization layers. By using non-volatile third dimension memory arrays, memory systems may be vertically-configured to reduce die size and while maintaining or enhancing overall chip functionality.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the present invention to any embodiment; rather features and aspects of one embodiment can readily be interchanged with other embodiments.

Thus, the foregoing descriptions of specific embodiments of the invention are presented for purposes of illustration and description. They are not intended to be exhaustive or to limit the invention to the precise forms disclosed; many alternatives, modifications, equivalents, and variations are possible in view of the above teachings. For the purpose of clarity, technical material that is known in the technical fields related to the embodiments has not been described in detail to avoid unnecessarily obscuring the description. Thus, the various embodiments can be modified within the scope and equivalents of the appended claims. Further, the embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the present invention; rather any specific embodiment can provide one or more of the advantages discussed above. In the claims, elements and/or operations do not imply any particular order of operation, unless explicitly stated in the claims. It is intended that the following claims and their equivalents define the scope of the invention.

What is claimed is:

1. An integrated circuit, comprising:
   a plurality of processors fabricated on a single substrate; and
   a third dimension memory fabricated directly above and in contact with the single substrate, the third dimension memory is electrically coupled with the plurality of processors and is configured to form different computer readable media for storing executable instructions,
   wherein at least one of the processors of the plurality of processors is responsive to the executable instructions and is configured to emulate an external port for communicating externally.

2. The integrated circuit of claim 1, wherein at least a portion of the plurality of processors and the third dimension memory are positioned in a single package.

3. The integrated circuit of claim 1, wherein the third dimension memory includes memory cells that are vertically stacked in relation to each other without an intervening substrate.

4. The integrated circuit of claim 1, wherein the external port comprises an input/output (I/O) port.

5. The integrated circuit of claim 4, wherein the I/O port is a port selected from the group consisting of a USB port, a Gigabit Ethernet port, a SATA port, an eSATA port, an 8B/10B Serializer/Deserializer port, an external DRAM port, an external SDRAM port, and an external FLASH memory port.

6. The integrated circuit of claim 1, wherein at least one of the processors of the plurality of processors comprises one or more FPGAs.

7. The integrated circuit of claim 1, wherein the plurality of processors are fabricated front-end-of-the-line (FEOL) on the single substrate and the third dimension memory is fabricated back-end-of-the-line (BEOL) directly above and in contact with the single substrate.

8. An integrated circuit, comprising:
   a logic subsystem fabricated on a single substrate; and
   a third dimension memory fabricated directly above and in contact with the single substrate, the third dimension memory is electrically coupled with the logic subsystem and is configured to form different computer readable media for storing executable instructions,
   wherein the logic subsystem includes a processing device responsive to the executable instructions and is configured to emulate an input/output (I/O) port.

9. The integrated circuit of claim 8, wherein the I/O port is a port selected from the group consisting of a USB port, a Gigabit Ethernet port, a SATA port, an eSATA port, an 8B/10B Serializer/Deserializer port, an external DRAM port, an external SDRAM port, and an external FLASH memory port.

10. The integrated circuit of claim 8, wherein at least a portion of the logic subsystem and the third dimension memory are positioned in a single package.

11. The integrated circuit of claim 8, wherein the third dimension memory includes memory cells that are vertically stacked in relation to each other without an intervening substrate.

12. The integrated circuit of claim 8, wherein the processing device comprises at least one FPGA.

13. The integrated circuit of claim 8, wherein the logic subsystem is fabricated front-end-of-the-line (FEOL) on the single substrate and the third dimension memory is fabricated back-end-of-the-line (BEOL) directly above and in contact with the single substrate.

* * * * *